United States Patent
Kushima

(10) Patent No.: US 8,018,326 B2
(45) Date of Patent: Sep. 13, 2011

(54) MATRIX SWITCH

(75) Inventor: Masahito Kushima, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 956 days.

(21) Appl. No.: 11/867,903

(22) Filed: Oct. 5, 2007

(65) Prior Publication Data

US 2008/0083603 A1    Apr. 10, 2008

(30) Foreign Application Priority Data

Oct. 5, 2006    (JP) .................. 2006-273902

(51) Int. Cl.
*H04Q 3/00*    (2006.01)
(52) U.S. Cl. .............. 340/14.69; 340/2.2; 340/2.22; 385/17
(58) Field of Classification Search ........ 340/14.69, 340/2.2, 2.22; 385/17, 22; 326/340; 333/104, 333/103
See application file for complete search history.

(56) References Cited

U.S. PATENT DOCUMENTS

| | | | |
|---|---|---|---|
| 3,694,775 A * | 9/1972 | Rogers | 333/101 |
| 3,711,834 A * | 1/1973 | Rogers | 340/14.69 |
| 3,713,105 A * | 1/1973 | Rogers | 340/2.2 |
| 3,808,566 A * | 4/1974 | Thompson et al. | 335/152 |
| 4,430,732 A * | 2/1984 | Saga et al. | 370/323 |
| 6,205,138 B1 * | 3/2001 | Nihal et al. | 370/388 |
| 6,496,082 B1 * | 12/2002 | DiPiazza | 333/101 |
| 7,307,490 B2 * | 12/2007 | Kizuki et al. | 333/101 |

FOREIGN PATENT DOCUMENTS

JP    2005-311688    11/2005

* cited by examiner

*Primary Examiner* — Benjamin C Lee
*Assistant Examiner* — Peter Mehravari
(74) *Attorney, Agent, or Firm* — Young & Thompson

(57) ABSTRACT

A matrix switch is provided with a plurality of input-terminals, a plurality of output-terminals, a plurality of connector switch elements connecting the plurality of input-terminals with the plurality of output-terminals, a plurality of input-terminal shunts associated with the plurality of input-terminals, and a plurality of output-terminal shunts associated with the plurality of output-terminals. Each input-terminal is connected to at least any one of the plurality of input-terminal shunts, and the input-terminal shunt connects the associated input-terminal to a predetermined impedance load as necessary. Each output-terminal is connected to at least any one of the plurality of output-terminal shunts, and the output-terminal shunt terminates the associated output-terminal in a predetermined impedance as necessary.

11 Claims, 9 Drawing Sheets

MATRIX SWITCH

BACKGROUND OF THE INVENTION

1. Field of the Invention

The present invention relates to a matrix switch. Particularly, the present invention relates to a matrix switch having a plurality of inputs and a plurality of outputs.

2. Description of Related

A matrix switch (switch matrix) is a circuit for internally connecting a plurality of input-terminals and a plurality of output-terminals. The connection is controlled in response to electric signals input to control terminals. A technique relevant to the matrix switch is described in the following patent document.

Japanese Laid Open Patent Application JP-P2005-311688A discloses a switch matrix. The switch matrix disclosed in Japanese Laid Open Patent Application JP-P2005-311688A is provided with two input-terminals, two input-side SPDT (Single-Pole Double-Throw) switches, four transmission lines, two output-terminals, and two output-side SPDT switches. Each of the input-side SPDT switches and the output-side SPDT switches includes two field-effect transistors as constituent elements. In the each SPDT switch, drains or sources of the two field-effect transistors are connected to one common terminal, while the others of the drains and the sources are respectively connected to two switch terminals. The two input-terminals are connected to the common terminals in the two input-side SPDT switches, respectively. The two output-terminals are connected to the common terminals in the two output-side SPDT switches, respectively. Moreover, the two switch terminals in the input-side SPDT switches and the two switch terminals in the output-side SPDT switches are connected one-to-one by the respective four transmission lines, such that a signal can be transmitted from each of the input-side SPDT switches to each of the output-side SPDT switches. Furthermore, the two switch terminals in each of the input-side SPDT switches are connected to each other through a resistor, or the two switch terminals in each of the output-side SPDT switches are connected to each other through a resistor.

SUMMARY

The inventor of the present application has recognized the following points.

FIG. 1 is a circuit diagram illustrating one example of a matrix switch. In general, an output-side device to be connected to an output-terminal of the matrix switch is an amplifier IC. In this case, for example, a load of 50Ω is connected to the output-terminal, and impedance is matched at an input-terminal electrically connected to the output-terminal.

With regard to the matrix switch shown in FIG. 1, FIG. 2 shows a case where input-terminals IN-A and IN-B are connected to output-terminals OUT1 and OUT2, respectively, and the output terminal OUT2 is in an open state. That is to say, a load of 50Ω is connected to only one output terminal OUT1 of the two output-terminals in the matrix switch. The other output terminal OUT2 not connected to a load of 50Ω is in an open state. At this time, the input-terminal IN-B electrically connected to the output-terminal OUT2 is electrically connected also to a shunt 40. Consequently, it is possible to prevent the input-terminal IN-B from coming into an open state.

FIG. 3 shows a case where an input-terminal inevitably comes into an open state in the matrix switch shown in FIG. 1. As in the case shown in FIG. 2, one output-terminal OUT1 of the two output-terminals 20 is in the open state. In FIG. 3, however, the same input-terminal IN-A is electrically connected to both of the output-terminals OUT1 and OUT2. Therefore, the input-terminal IN-A cannot be electrically connected to a shunt 40. Thus, the impedance of the other output terminal OUT2 deviates from 50 Ω.

As described above, in the matrix switch provided with the plurality of output-terminals, there may be a case where a part of the output-terminals is not connected to the load and hence impedance of another output-terminal deviates from 50Ω, which results in malfunction of the matrix switch. In other words, there is a case where a specific combination of input-output terminals is unusable when electrically connecting the plurality of input-terminals with the plurality of output-terminals. A user of the matrix switch needs to grasp all the unusable combinations in advance and to control the matrix switch to prevent any unusable combination.

It is therefore desired to provide a technique that can achieve impedance matching at each of the input-terminals and the output-terminals electrically connected to an arbitrary output-terminal even if the arbitrary output-terminal is in an open state.

In one embodiment of the present invention, a matrix switch is provided with a plurality of input-terminals, a plurality of output-terminals, a plurality of connector switch elements connecting the plurality of input-terminals with the plurality of output-terminals, a plurality of input-terminal shunts associated with the plurality of input-terminals, and a plurality of output-terminal shunts associated with the plurality of output-terminals. Each of the plurality of input-terminals is connected to at least any one of the plurality of input-terminal shunts, and an input-terminal shunt connects an associated input-terminal to a predetermined impedance load as necessary. Each of the plurality of output-terminals is connected to at least any one of the plurality of output-terminal shunts, and an output-terminal shunt terminates an associated output-terminal in a predetermined impedance as necessary.

In another embodiment of the present invention, an output-terminal shunt connected to an output-terminal of a matrix switch is provided. The output-terminal shunt includes a switch element and an impedance setting circuit, and terminates the output-terminal in a predetermined impedance when the output-terminal is in an open state.

In still another embodiment of the present invention, a method of matching an impedance of a matrix switch is provided. The method includes: (a) controlling a voltage applied to a connector switch element control terminal to connect or disconnect an input-terminal with an associated output-terminal through a connector switch element with respect to each of combinations of a plurality of input-terminals and a plurality of output-terminals; (b) controlling a voltage applied to an input-terminal shunt control terminal to connect or disconnect an input-terminal with a predetermined impedance load by an associated input-terminal shunt with respect to each of combinations of the plurality of input-terminals and the plurality of output-terminals; and (c) controlling a voltage applied to an output-terminal shunt control terminal to connect or disconnect an output-terminal with a predetermined impedance load by an associated output-terminal shunt with respect to each of the plurality of output-terminals.

When an arbitrary output-terminal is in an open state, an input-terminal electrically connected to the arbitrary output-terminal is terminated in a predetermined impedance and thereby does not come into an open state. The number of the output-terminal shunts to be controlled is equal to the number of the output-terminals, and it is not necessary to consider a combination with the connector switch element or the input-terminal shunt. Thus, management and operation are simple.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

A matrix switch according to an embodiment of the present invention will be described below with reference to the attached drawings.

Figure 4:
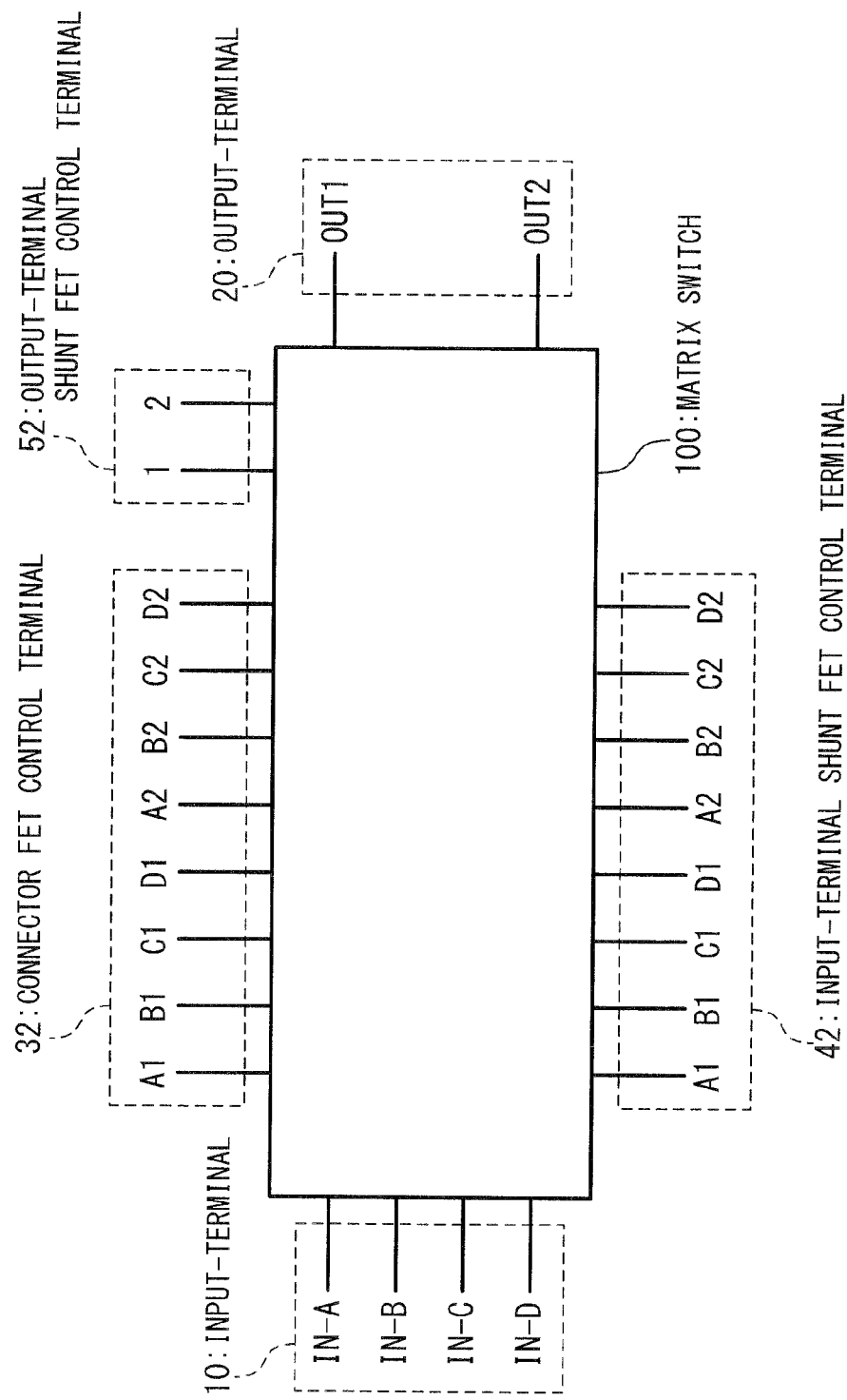
FIG. 4 is an overall view showing all terminals of a matrix switch according to an embodiment of the present invention.

FIG. 4 is a view showing all terminals of the matrix switch according to the present embodiment. The matrix switch 100 in the present embodiment is an integrated circuit (IC) provided with four input-terminals 10 and two output-terminals 20. Here, the four input-terminals 10 are designated by "IN-A", "IN-B", "IN-C" and "IN-D", respectively. Also, the two output-terminals 20 are designated by "OUT1" and "OUT2", respectively. It should be noted that the numbers of the input-terminals 10 and the output-terminals 20 are merely examples, and other numbers are possible.

Figure 5:
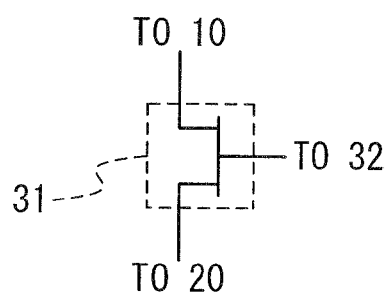
FIG. 5 is a circuit diagram illustrating a connector FET according to the embodiment.

FIG. 5 illustrates a connector switch element 31 provided in the matrix switch 100. According to the present embodiment, the connector switch element 31 is a connector FET (Field Effect Transistor) as shown in FIG. 5.

The matrix switch 100 is provided with a plurality of connector FETs 31 for connecting the input-terminals 10 with the output-terminals 20. The number of the connector FETs 31 is equal to the number of combinations of the input-terminals 10 and the output-terminals 20, namely a product of the number of the input-terminals 10 and the number of the output-terminals 20. In the present embodiment, the number of the connector FETs 31 is eight. The respective connector FETs 31 are provided on connection paths between the four input-terminals 10 and the two output-terminals. With regard to each of the combinations of the input-terminals 10 and the output-terminals 20, the associated input-terminal 10 and output-terminal 20 are connected to each other through an associated connector FET 31, and the associated connector FET 31 plays a role of electrically connecting or disconnecting the associated input-terminal 10 and output-terminal 20 with each other. It should be noted that each of the connector FETs 31 may be designated and denoted with an extension, for example, "a connector FET 31-A1". The first alphabetic character "A" of the extension "A1" indicates an associated input-terminal 10 (here, the input-terminal IN-A), while the last numeric character "1" of the extension "A1" indicates an associated output-terminal 20 (here, the output-terminal OUT1).

Moreover, as shown in FIG. 5, a gate of the connector FET 31 is connected to a connector FET control terminal (connector switch element control terminal) 32. Referring to FIG. 4 again, the matrix switch 100 in the present embodiment is further provided with a plurality of connector FET control terminals 32. The number of the connector FET control terminals 32 is equal to the number of the connector FETs 31, namely eight. It should be noted that each connector FET control terminal 32 may be designated and denoted with an extension as in the associated connector FET 31. That is to say, the eight connector FET control terminals 32-A1 to 32-D2 are connected to gates of the eight connector FETs 31-A1 to 31-D2, respectively.

Figure 6:
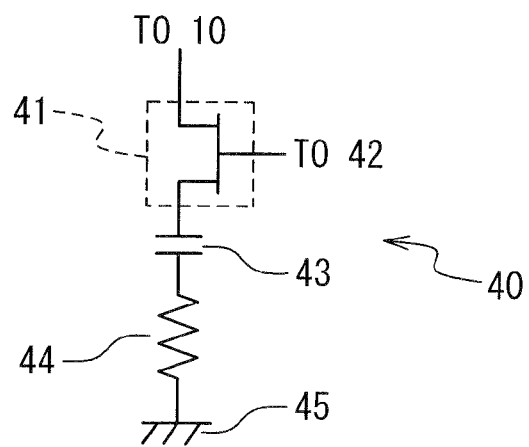
FIG. 6 is a circuit diagram illustrating an input-terminal shunt according to the embodiment.

FIG. 6 illustrates an input-terminal shunt 40 provided in the matrix switch 100 and associated with the input-terminal 10. The input-terminal shunt 40 according to the present embodiment includes an input-terminal shunt FET 41, an input-terminal shunt capacitor 43 and an input-terminal shunt resistor 44. One of a source and a drain of the input-terminal shunt FET 41 is connected to any of the input-terminals 10, while the other is connected to the capacitor 43. The input-terminal shunt FET 41 functions as a switch element. The capacitor 43 and the resistor 44 are connected in series between the input-terminal shunt FET 41 and a ground terminal 45, and functions as an impedance setting circuit.

The matrix switch 100 is provided with a plurality of input-terminal shunts 40 that are associated with the input-terminals 10. Each of the input-terminals 10 is connected to at least any one of the input-terminal shunts 40, and the input-terminal shunt 40 connects an associated input-terminal 10 to a predetermined impedance load as necessary. More specifically, in the present embodiment, the number of the input-terminal shunts 40 is equal to the number of combinations of the input-terminals 10 and the output-terminals 20, namely a product of the number of the input-terminals 10 and the number of the output-terminals 20. In the present embodiment, the number of the input-terminal shunts 40 is eight. The input-terminal shunts 40 are respectively connected to paths between the input-terminals 10 and the connector FETs 31. In a case where a certain input-terminal 10 is electrically disconnected with the associated output-terminal 20 by the associated connector FET 31 provided therebetween, the certain input-terminal 10 is electrically connected to an associated input-terminal shunt 40 and the associated input-terminal shunt 40 connects the certain input-terminal 10 to the predetermined impedance load. It should be noted that each of the input-terminal shunts 40 may be designated and denoted with an extension, for example, "an input-terminal shunt 40-A1". The first alphabetic character "A" of the extension "A1" indicates the associated input-terminal 10 (here, the input-terminal IN-A), while the last numeric character "1" of the extension "A1" indicates the associated output-terminal 20 (here, the output-terminal OUT1).

Moreover, as shown in FIG. 6, a gate of the input-terminal shunt FET 41 is connected to an input-terminal shunt FET control terminal 42. Referring to FIG. 4 again, the matrix switch 100 in the present embodiment is further provided with a plurality of input-terminal shunt FET control terminals 42. The number of the input-terminal shunt FET control terminals 42 is equal to the number of the input-terminal shunts 40, namely eight. It should be noted that each input-terminal shunt FET control terminal 42 may be designated and denoted with an extension as in the associated input-terminal shunt 40. That is to say, the eight input-terminal shunt FET control terminals 42-A1 to 42-D2 are connected to gates of the eight input-terminal shunt FETs 41 of the eight input-terminal shunts 40-A1 to 40-D2, respectively.

Figure 7:
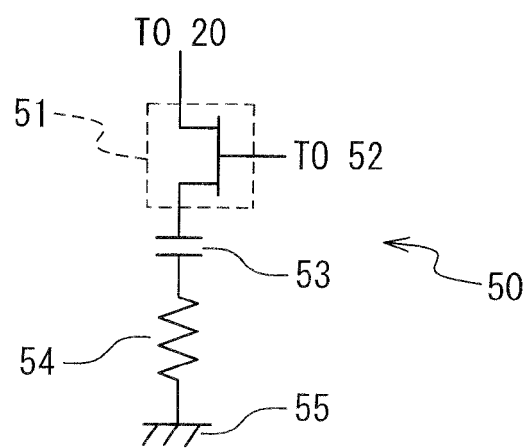
FIG. 7 is a circuit diagram illustrating an output-terminal shunt according to the embodiment.

FIG. 7 illustrates an output-terminal shunt 50 provided in the matrix switch 100 and associated with the output-terminal 20. The output-terminal shunt 50 according to the present embodiment includes an output-terminal shunt FET 51, an output-terminal shunt capacitor 53 and an output-terminal shunt resistor 54. One of a source and a drain of the output-terminal shunt FET 51 is connected to any of the output-terminals 20, while the other is connected to the capacitor 53. The output-terminal shunt FET 51 functions as a switch element. The capacitor 53 and the resistor 54 are connected in series between the output-terminal shunt FET 51 and a ground terminal 55, and functions as an impedance setting circuit.

The matrix switch 100 is provided with a plurality of output-terminal shunts 50 that are associated with the output-terminals 20. Each of the output-terminals 20 is connected to at least any one of the output-terminal shunts 50, and the output-terminal shunt 50 terminates an associated output-terminal 20 in a predetermined impedance as necessary. More specifically, in the present embodiment, the number of the output-terminal shunts 50 is equal to the number of the output-terminals 20, namely two. In other words, the output-terminal shunts 50 are connected to the output-terminals 20, respectively. In a case where an associated output-terminal 20 is in an open state, the output-terminal shunt 50 terminates the associated output-terminal 20 in the predetermined impedance. It should be noted that each of the output-terminal shunts 50 may be designated and denoted with an extension, for example, "an output-terminal shunt 50-1". The numeric character "1" indicates the associated output-terminal 20 (here, the output-terminal OUT1).

Moreover, as shown in FIG. 7, a gate of the output-terminal shunt FET 51 is connected to an output-terminal shunt FET control terminal 52. Referring to FIG. 4 again, the matrix switch 100 in the present embodiment is further provided with a plurality of output-terminal shunt FET control terminals 52. The number of the output-terminal shunt FET control terminals 52 is equal to the number of the output-terminal shunts 50, namely two. It should be noted that each output-terminal shunt FET control terminal 52 may be designated and denoted with an extension as in the associated output-terminal shunt 50. That is to say, the two output-terminal shunt FET control terminals 52-1 and 52-2 are connected to gates of the output-terminal shunt FETs 51 of the two output-terminal shunts 50-1 and 50-2, respectively.

Figure 8:
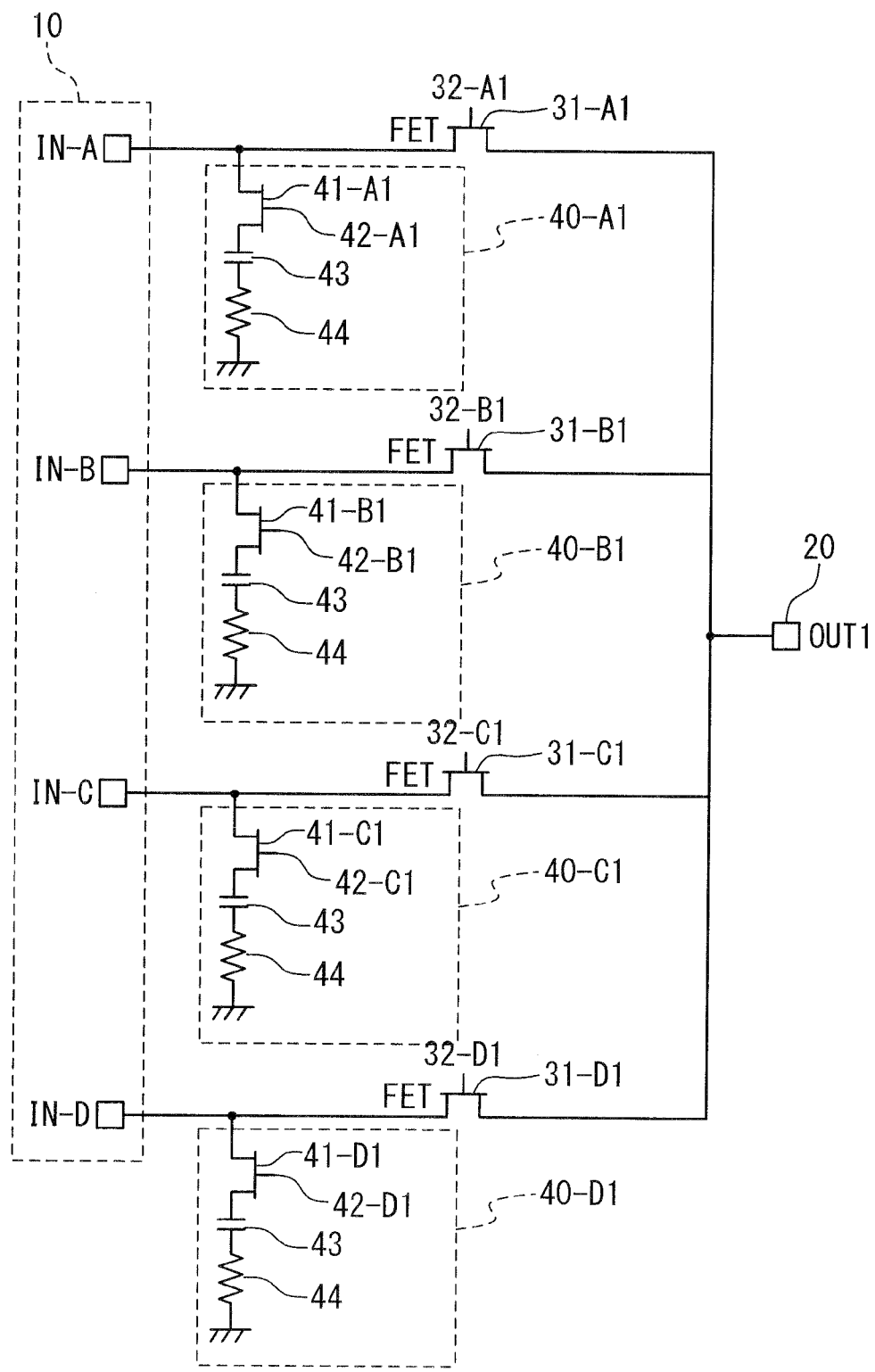
FIG. 8 is a circuit diagram showing a part of a configuration of the matrix switch according to the embodiment.

FIG. 8 is a circuit diagram showing a part of a configuration of the matrix switch 100 according to the present embodiment. Shown in FIG. 8 is a unit relevant to the output-terminal OUT1 of the output-terminals 20. The configuration with regard to the other output-terminal OUT2 is similar.

As shown in FIG. 8, the input-terminals 10 (IN-A, IN-B, IN-C and IN-D) are connected to the output-terminal 20 (OUT1) through the connector FETs 31 (31-A1, 31-B1, 31-C1 and 31-D1), respectively. Specifically, one of a source and a drain of one connector FET 31 is connected to one input-terminal 10, while the other is connected to the one output-terminal OUT1. The connector FETs 31-A1, 31-B1, 31-C1 and 31-D1 are respectively provided on the connection paths between the input-terminals IN-A, IN-B, IN-C and IN-D and the output terminal OUT1. It should be noted that the connection here indicates a physical connection and an electrical connection between an input-terminal 10 and the output terminal OUT1 is achieved when the associated connector FET 31 is turned ON (in an electrically conductive state). In order to achieve the connection through the connector FET 31 on each of the connection paths, it is necessary to provide the same number of connector FETs 31 as the product of the number of the input-terminals 10 and the number of the output-terminals 20. The gates of the connector FETs 31-A1, 31-B1, 31-C1 and 31-D1 are connected to the connector FET control terminals 32-A1, 32-B1, 32-C1 and 32-D1, respectively.

Moreover, as shown in FIG. 8, four input-terminal shunts 40 (40-A1, 40-B1, 40-C1 and 40-D1) are connected to the input terminals 10 (IN-A, IN-B, IN-C and IN-D), respectively. More specifically, the input-terminal shunts 40-A1, 40-B1, 40-C1 and 40-D1 are connected to paths between the input-terminals IN-A, IN-B, IN-C and IN-D and the connector FETs 31-A1, 31-B1, 31-C1 and 31-D1, respectively. With regard to each of the input-terminal shunts 40, one end is grounded and the input-terminal shunt FET 41 is provided at the other end, as described above. The input-terminal shunt FET 41 (switch element) is connected to the associated input-terminal 10. Which one of the source and the drain of the input-terminal shunt FET 41 is connected to the input-terminal 10 is determined depending on a direction of a current flowing between the input-terminal 10 and the ground.

Figure 9:
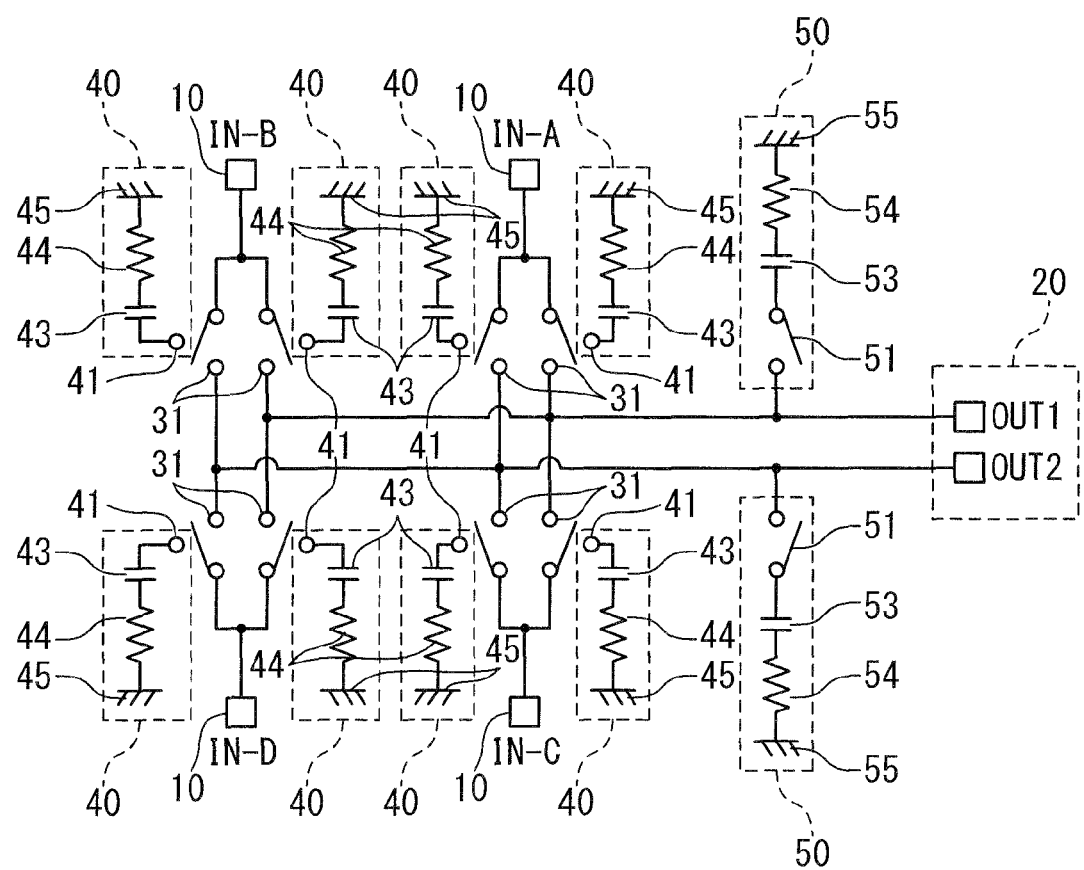
FIG. 9 is a circuit diagram illustrating a configuration of the matrix switch according to an embodiment of the present invention.

As shown in FIG. 9, the output-terminal shunts 50 (50-1 and 50-2) are connected to the output-terminals 20 (OUT1 and OUT2), respectively. With regard to each of the output-terminal shunts 50, one end is grounded and the output-terminal shunt FET 51 is provided at the other end, as described above. The output-terminal shunt FET 51 (switch element) is connected to the associated output-terminal 20. One of the source and the drain of the output-terminal shunt FET 51 is connected to the output-terminal 20, while the other is connected to the impedance setting circuit (the capacitor 53 and the resistor 54).

Also, the gates of the input-terminal shunt FETs 41 are connected to the associated input-terminal shunt FET control terminals 42, respectively. The gate of the output-terminal shunt FETs 51 are connected to the associated output-terminal shunt FET control terminals 52, respectively.

With respect to the matrix switch 100, an arbitrary input-side device (not shown) is connected to the input-terminals 10. Also, an arbitrary output-side device (not shown) is connected to the output-terminals 20. In general, the output-side device is an amplifier circuit. An arbitrary control device (not shown) is connected to the connector FET control terminals 32 and the shunt FET control terminals 42 and 52. It is preferable that a device for controlling the power of the above-mentioned output-side device is connected to the control device for controlling the FET control terminals 32, 42 and 52.

FIG. 9 is a circuit diagram illustrating a configuration of the matrix switch 100 according to the present embodiment. An operation of the matrix switch 100 according to the present embodiment will be described below in more detail with reference to FIG. 9.

With regard to a combination of a certain input-terminal 10 and a certain output-terminal 20, the associated connector FET 31 and the associated input-terminal shunt FET 41 function as one single-pole double-throw (SPDT) switch, and any one of the associated connector FET 31 and the associated input-terminal shunt FET 41 is turned ON. In a case where the associated connector FET 31 is turned ON and electrically connects the certain input-terminal 10 with the certain output-terminal 20, the associated input-terminal shunt FET 41 is turned OFF and the impedance setting circuit of the input-terminal shunt 40 is electrically disconnected with the certain input-terminal 10. On the other hand, in a case where the associated connector FET 31 is turned OFF and electrically disconnects the certain input-terminal 10 with the certain output-terminal 20, the associated input-terminal shunt FET 41 is turned ON and the impedance setting circuit of the input-terminal shunt 40 is electrically connected with the certain input-terminal 10. When the input-terminal shunt FET 41 is turned ON, the input-terminal shunt 40 connects the associated input-terminal 10 to the predetermined impedance load.

More specifically, with respect to each of the combinations of the input-terminals 10 and the output-terminals 20, a voltage applied to the associated connector FET control terminal 32 is controlled to connect or disconnect the associated input-terminal 10 with the associated output-terminal 20. Similarly, with respect to each of the combinations of the input-terminals 10 and the output-terminals 20, a voltage applied to the associated input-terminal shunt FET control terminal 42 is controlled to connect or disconnect the associated input-terminal 10 with the associated input-terminal shunt 40 (the predetermined impedance load).

On the other hand, it is determined whether or not each output-terminal 20 is in an open state. In a case where a certain output-terminal 20 is in an open state, the associated output-terminal shunt FET 51 is turned ON and the output-terminal shunt 50 terminates the certain output-terminal 20 in a predetermined impedance load. On the other hand, in a case where a certain output-terminal 20 is not in an open state, the associated output-terminal shunt FET 51 is turned OFF and the output-terminal shunt 50 disconnects the certain output-terminal 20 with the predetermined impedance load. With respect to each of the output-terminals 20, a voltage applied to the associated output-terminal shunt FET control terminal 52 is controlled to connect or disconnect the associated output-terminal 20 with the associated output-terminal shunt 50 (the predetermined impedance load).

It is preferable here that the determination of an output terminal 20 being in an open state is automated by utilizing the fact that the output terminal 20 becomes in the open state when the power of the output-side device is in the OFF-state. For example, the above-mentioned control device receives a signal from a power control device for controlling the power of the output-side device. Then, the control device controls the voltages applied to the output-terminal shunt FET control terminals 52 in conjunction with the power state of the output-side device.

According to the present embodiment, it is possible to prevent each of the input-terminals 10 and the output-terminals 20 electrically connected to an open-state output terminal 20 from coming into the open state, when matching the impedance.

Figure 3:
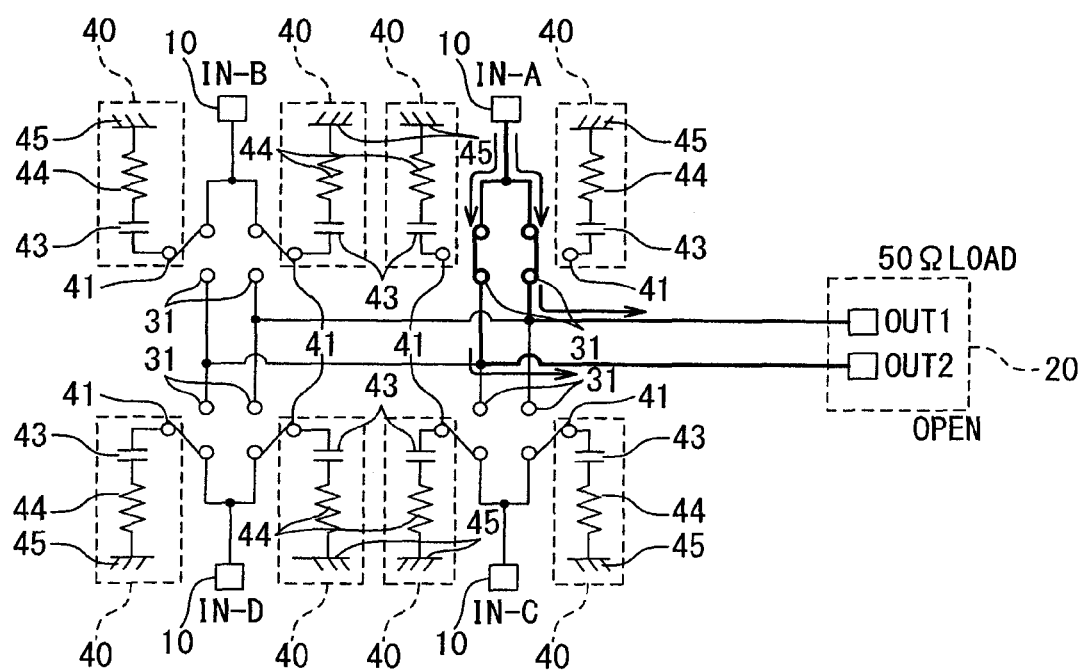
FIG. 3 is a circuit diagram showing another case where one output-terminal is in an open state with regard to a configuration shown in FIG. 1.
Figure 10:
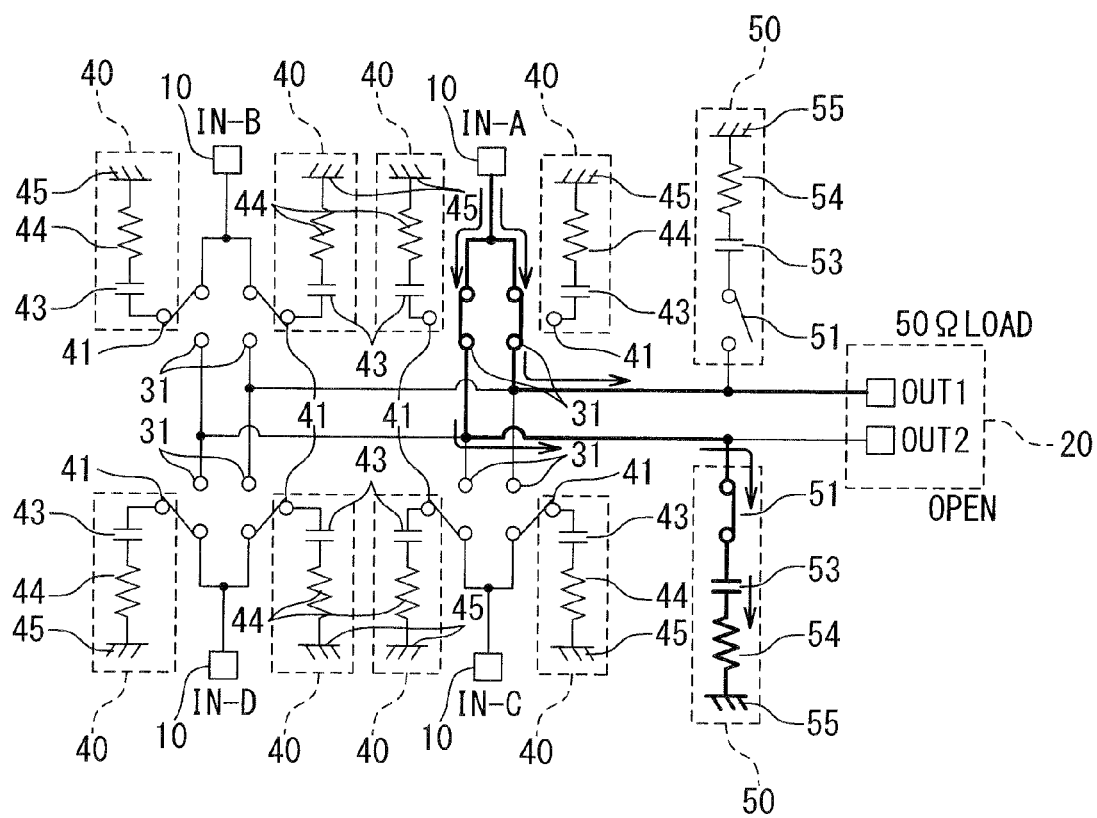
FIG. 10 is a circuit diagram showing a case where one output-terminal is in an open state with regard to the configuration shown in FIG. 9.

FIG. 10 shows a case where one output-terminal OUT2 of the output-terminals 20 is in an open state with regard to the configuration shown in FIG. 9. The configuration shown in FIG. 10 corresponds to that in which the output-terminal shunts 50 according to the present embodiment are added to the matrix switch shown in FIG. 3. More specifically, the same input terminal IN-A is electrically connected to both the output terminals OUT1 and OUT2. Also, one output-terminal shunt 50-2 is electrically connected to the output-terminal OUT2 in the open state and to the input-terminal IN-A. Although the output-terminal OUT2 to which the input-terminal IN-A is electrically connected is in the open state, the input-terminal IN-A is electrically connected to the output-terminal shunt 50-2. In other words, the input-terminal IN-A cannot be electrically connected to the input-terminal shunt 40-A2 but is electrically connected to the output-terminal shunt 50-2 instead. As a result, each of the input-terminal IN-A and the other output-terminal OUT1, which are electrically connected with the open-state output-terminal OUT2, is not in an open state. That is to say, it is possible to prevent the input-terminal IN-A and the output-terminal OUT1 from coming into the open state and to attain the impedance matching.

Figure 1:
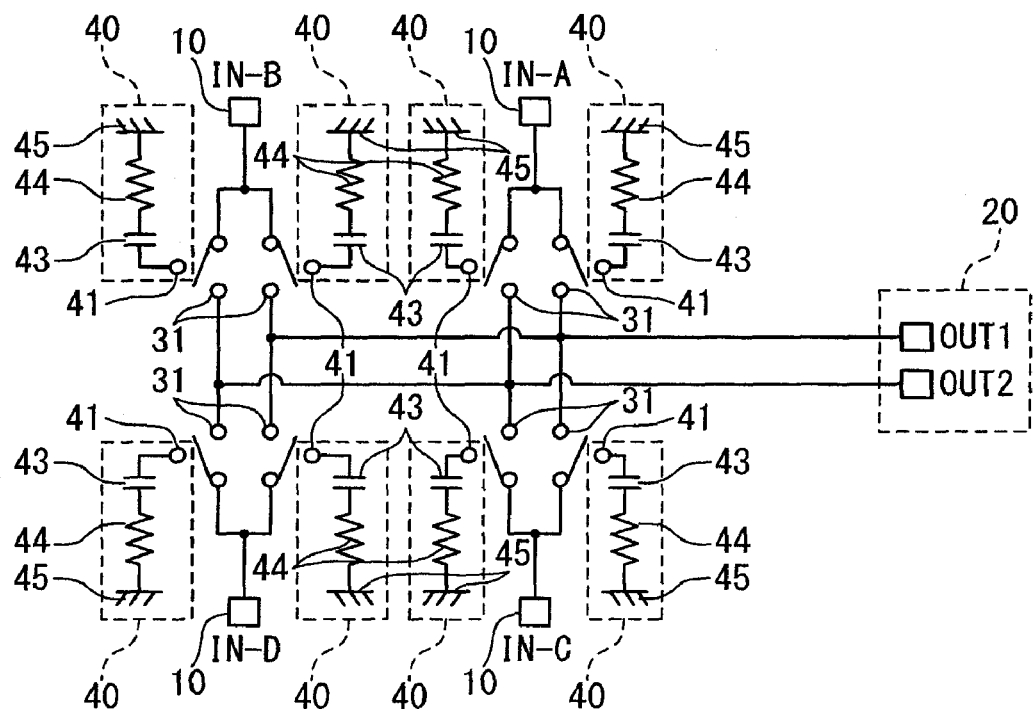
FIG. 1 is a circuit diagram illustrating an example of a matrix switch.
Figure 2:
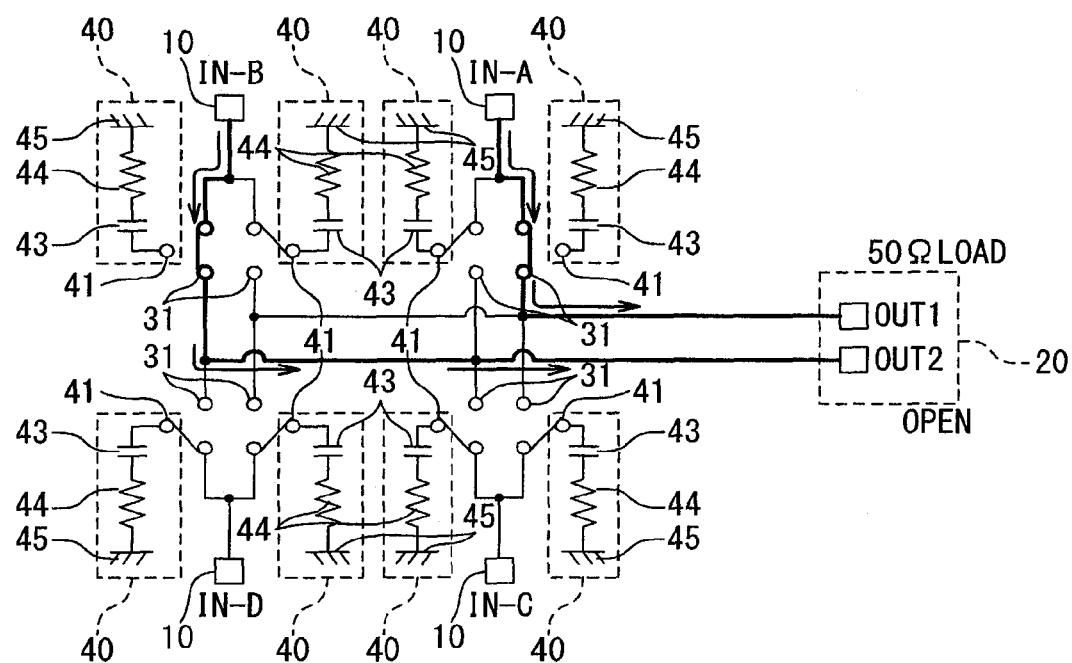
FIG. 2 is a circuit diagram showing a case where one output-terminal is in an open state with regard to a configuration shown in FIG. 1.
Figure 11:
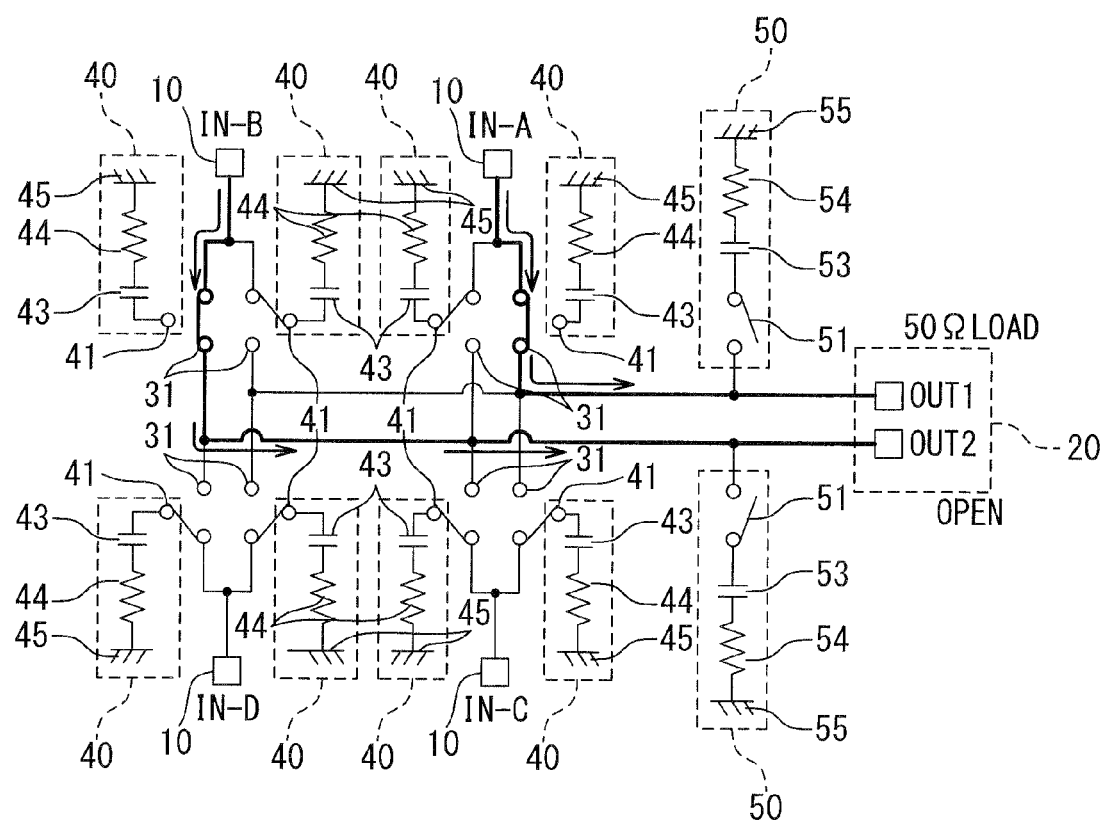
FIG. 11 is a circuit diagram showing another case where one output-terminal is in an open state with regard to the configuration shown in FIG. 9.

FIG. 11 shows another case where one output-terminal OUT2 of the output-terminals 20 is in an open state with regard to the configuration shown in FIG. 9. The configuration shown in FIG. 11 corresponds to that in which the output-terminal shunts 50 according to the present embodiment are added to the matrix switch shown in FIG. 2. More specifically, the input-terminal IN-A is electrically connected to the output-terminal OUT1, while the input-terminal IN-B is electrically connected to the output-terminal OUT2 in the open state. Also, the input-terminal IN-B is electrically connected to the input-terminal shunt 40-B1. Although the output-terminal OUT2 to which the input-terminal IN-B is electrically connected is in the open state, the input-terminal IN-B is electrically connected to the input-terminal shunt 40-B1 and does not affect the output-terminal OUT1 at all. In this manner, even when the output-terminal shunts 50 according to the present embodiment are added to the matrix switch, it does not hinder the function of the matrix switch.

It is apparent that the present invention is not limited to the above embodiments and may be modified and changed without departing from the scope and spirit of the invention.

What is claimed is:

1. A matrix switch comprising:
   a plurality of input-terminals;
   a plurality of output-terminals;
   a plurality of connector switch elements having first and second terminals connecting said plurality of input-terminals with said plurality of output-terminals, each connector switch element having a third terminal configured as a connector control terminal for turning that connector switch element on and off; a plurality of input-terminal shunts associated with said plurality of input-terminals, each input-terminal shunt comprising a terminal configured as an input-terminal shunt control terminal for turning that input-terminal shunt on and off,
   wherein each of said plurality of input-terminals is connected to at least one of said plurality of input-terminal shunts, and the connected at least one input-terminal shunt selectively connects an associated input-terminal to a fixed input impedance load; and a plurality of output-terminal shunts associated with said plurality of output-terminals, each output-terminal shunt comprising a terminal configured as an output-terminal shunt control terminal for turning that output-terminal shunt on and off, wherein each of said plurality of output-terminals is connected to at least one of said plurality of output-terminal shunts and the output-terminal shunt selectively terminates an associated output-terminal in a fixed output impedance, wherein a number of said plurality of connector switch elements is equal to a number of combinations of said plurality of input-terminals and said plurality of output-terminals, and said plurality of connector switch elements are respectively provided on connection paths between said plurality of input-terminals and said plurality of output-terminals, wherein a number of said plurality of input-terminal shunts is equal to a number of combinations of said plurality of input-terminals and said plurality of output-terminals, and said plurality of input-terminal shunts are respectively connected to paths between said plurality of input-terminals and said plurality of connector switch elements, and wherein a number of said plurality of output-terminal shunts is equal to a number of said plurality of output-terminals, and said plurality of output-terminal shunts are respectively connected to said plurality of output-terminals.

2. The matrix switch according to claim 1,
wherein said output-terminal shunt terminates said associated output-terminal in said fixed output impedance when said associated output-terminal is in an open state.

3. The matrix switch according to claim 1,
wherein said associated input-terminal is connected to one of said plurality of output-terminals through one of said plurality of connector switch elements, and
wherein said input-terminal shunt connects said associated input-terminal to said predetermined impedance load when said one connector switch element electrically disconnects said associated input-terminal with said one output terminal.

4. The matrix switch according to claim 1,
wherein each of said plurality of output terminal shunts includes a switch element and an impedance setting circuit.

5. The matrix switch according to claim 4,
wherein said switch element is an FET whose gate is connected to an output-terminal shunt control terminal.

6. The matrix switch according to claim 4,
wherein said impedance setting circuit includes a resistor and a capacitor.

7. The matrix switch according to claim 1,
wherein each of said plurality of connector switch elements is an FET whose gate is connected to a connector switch element control terminal.

8. A method of matching an impedance of a matrix switch, comprising:
(a) controlling a voltage applied to a connector switch element control terminal to selectively connect or disconnect an input-terminal with an associated output-terminal through a connector switch element with respect to each of combinations of a plurality of input-terminals and a plurality of output-terminals, wherein, a number of said plurality of connector switch elements is equal to a number of the combinations of the plurality of input-terminals and said plurality of output-terminals, and said plurality of connector switch elements are respectively provided on connection paths between said plurality of input-terminals and said plurality of output-terminals;

(b) controlling a voltage applied to an input-terminal shunt control terminal to selectively connect or disconnect an input-terminal with a fixed input impedance load by an associated input-terminal shunt with respect to each of combinations of said plurality of input-terminals and said plurality of output-terminals, wherein a number of said plurality of input-terminal shunts is equal to a number of the combinations of said plurality of input-terminals and said plurality of output-terminals, and said plurality of input-terminal shunts are respectively connected to paths between said plurality of input-terminals and said plurality of connector switch elements; and (c) controlling a voltage applied to an output-terminal shunt control terminal to selectively connect or disconnect an output-terminal with a fixed output impedance load by an associated output-terminal shunt with respect to each of said plurality of output-terminals, wherein a number of said plurality of output-terminal shunts is equal to a number of said plurality of output-terminals, and said plurality of output-terminal shunts are respectively connected to said plurality of output-terminals.

9. The method according to claim 8,
wherein said (c) step includes:
(c1) terminating said output-terminal in said predetermined impedance load when said output-terminal is in an open state; and
(c2) disconnecting said output-terminal with said predetermined impedance load when said output-terminal is not in an open state.

10. A matrix switch comprising:
a plurality of input-terminals;
a plurality of output-terminals;
a plurality of connector switch elements connecting said plurality of input-terminals with said plurality of output-terminals;
a plurality of input-terminal shunts associated with said plurality of input-terminals,
wherein each of said plurality of input-terminals is connected to at least one of said plurality of input-terminal shunts, and the connected at least one input-terminal shunt selectively connects an associated input-terminal to a fixed input impedance load; and
a plurality of output-terminal shunts associated with said plurality of output-terminals,
wherein each of said plurality of output-terminals is connected to at least one of said plurality of output-terminal shunts and the output-terminal shunt selectively terminates an associated output-terminal in a fixed output impedance,
wherein a number of said plurality of input-terminal shunts is equal to a number of combinations of said plurality of input-terminals and said plurality of output-terminals, and said plurality of input-terminal shunts are respectively connected to paths between said plurality of input-terminals and said plurality of connector switch elements.

11. The matrix switch according to claim 10,
wherein a number of said plurality of connector switch elements is equal to a number of combinations of said plurality of input-terminals and said plurality of output-terminals, and said plurality of connector switch elements are respectively provided on connection paths between said plurality of input-terminals and said plurality of output-terminals, and wherein a number of said plurality of output-terminal shunts is equal to a number of said plurality of output-terminals, and said plurality of output-terminal shunts are respectively connected to said plurality of output-terminals.

* * * * *